(12) United States Patent
Witt

(10) Patent No.: US 8,580,665 B2
(45) Date of Patent: Nov. 12, 2013

(54) MOSFET INTEGRATED CIRCUIT HAVING DOPED CONDUCTIVE INTERCONNECTS AND METHODS FOR ITS MANUFACTURE

(75) Inventor: Christian Witt, Woodbridge, CT (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 68 days.

(21) Appl. No.: 13/267,739

(22) Filed: Oct. 6, 2011

(65) Prior Publication Data

US 2013/0089980 A1  Apr. 11, 2013

(51) Int. Cl.
*H01L 21/38* (2006.01)

(52) U.S. Cl.
USPC .............. 438/558; 438/687; 257/E21.579

(58) Field of Classification Search
USPC ............ 438/288, 591, 558, 687; 257/E21.21, 257/E21.579
See application file for complete search history.

(56) References Cited

U.S. PATENT DOCUMENTS 6,506,668 B1 * 1/2003 Woo et al. ............ 438/584
6,518,185 B1 * 2/2003 Wang et al. .......... 438/687

* cited by examiner

*Primary Examiner* — Trung Q Dang
(74) *Attorney, Agent, or Firm* — Ingrassia Fisher & Lorenz, P.C.

(57) ABSTRACT

An integrated circuit device having doped conductive contacts, and methods for its fabrication, are provided. One such method involves depositing a dielectric layer on the surface of a silicon semiconductor substrate, and photolithographically patterning a plurality of contact trenches on the dielectric layer. A tantalum barrier is deposited in the trenches, followed by a copper seed layer. The trenches are then plated with copper, including an overburden. A layer of doping material is deposited atop the overburden, and diffused into the copper by a heat treatment process. The overburden is then removed through chemical mechanical planarization, resulting in usable conductive interconnects in the trenches.

15 Claims, 8 Drawing Sheets

US 8,580,665 B2

MOSFET INTEGRATED CIRCUIT HAVING DOPED CONDUCTIVE INTERCONNECTS AND METHODS FOR ITS MANUFACTURE

TECHNICAL FIELD

The present invention generally relates to semiconductor devices and methods for their fabrication, and more particularly to improved methods for fabricating MOSFET devices with inlayed conductive metal interconnects.

BACKGROUND

The transistor is the basic building block of all present day integrated circuit (IC) designs and devices. Fundamentally, a transistor is an electronic switch which includes a source region, a drain region electrically insulated from the source, and a control gate. A control voltage applied to the gate electrode selectively controls electrical communication between the source and drain electrodes, thereby controlling the binary ("on" and "off") state of the device.

A common integrated circuit implementation involves interconnecting a large number of field effect transistors (FETs), typically metal oxide semiconductor field effect transistors (MOSFETs), resulting in a highly complex, three dimensional integrated circuit device. The mechanical and electrical integrity of the source, drain, and gate electrodes of these transistors can significantly impact device performance, device variation, and manufacturing yield.

As the number and complexity of functions implemented in IC devices (such as microprocessors and memory devices) increases, more and more transistors must be incorporated into the underlying integrated circuit chip. The fabrication of large scale integrated circuit devices presents a number of competing manufacturing and processing challenges.

Presently known methods for interconnecting the many transistors that make up the finished integrated circuit include patterning contact trenches into the surface of an insulating layer, and filling the trenches with copper to form conductive interconnects. Copper is disadvantageous in that it tends to migrate along boundaries between the layers of dielectric material that electrically isolate the various interconnecting levels from one another. Copper electromigration can be mitigated by adding certain metallurgical additives, or dopants (alloying elements), to the main copper interconnect body. However, this adds complexity and cost to the metallization procedure, and may not be feasible for some dopants.

Accordingly, a need exists to provide methods for fabricating MOSFET ICs on a silicon substrate with conductive interconnecting layers having a desired dopant amount in a manner which is flexible and cost efficient. Furthermore, other desirable features and characteristics of various embodiments will become apparent from the subsequent summary, detailed description, and the appended claims, taken in conjunction with the accompanying drawings, brief description of the drawings, the foregoing technical field and this background of the invention.

BRIEF SUMMARY

In accordance with one embodiment, a method for fabricating a MOSFET and other integrated circuits having doped conductive interconnects includes forming a dielectric layer over a silicon substrate, and photolithographically patterning a plurality of contact trenches in the dielectric layer. A barrier layer is deposited in the trenches, followed by a copper seed layer. The trenches are then plated with copper including a copper overburden. A layer of dopant material is deposited on top of the overburden, and diffused into the copper by a mild heat treatment. The overburden is then removed by chemical mechanical planarization.

BRIEF DESCRIPTION OF THE DRAWINGS

The present invention will hereinafter be described in conjunction with the following drawing figures, wherein like numerals denote like elements, and.

DETAILED DESCRIPTION

Figure 1:
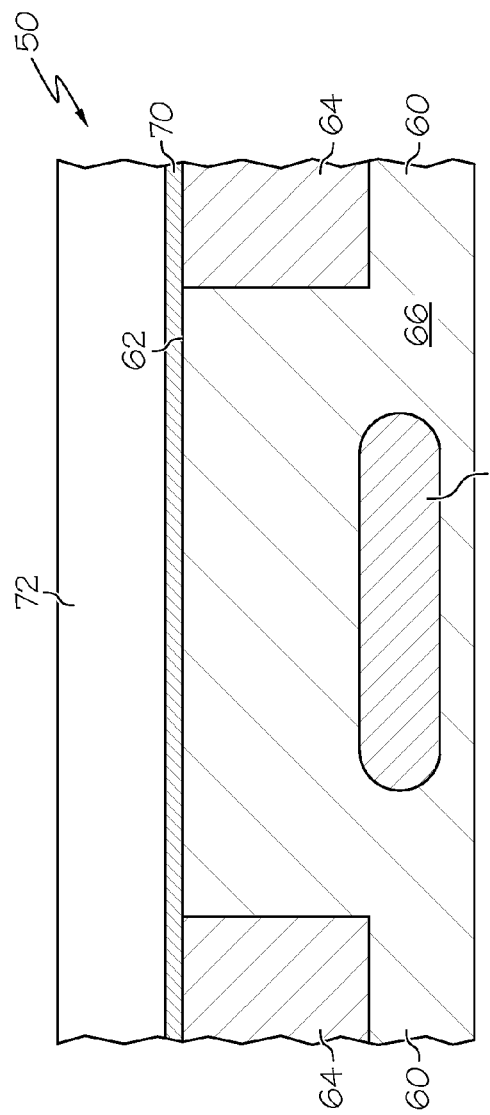
FIGS. 1-4 illustrate, in cross section, a MOSFET integrated circuit device and various prior art fabrication methods.

The following detailed description is merely exemplary in nature and is not intended to limit the invention or the application and uses of the invention. Furthermore, the invention is not bound by any theory presented in the preceding background or the following detailed description.

Methods are provided for forming conductive interconnect layers in MOSFET integrated circuit (IC) devices. One such method involves an inlay metallization process wherein recessed traces are patterned into a dielectric layer. The traces are then lined by a thin adhesion barrier layer, followed by a seed layer to facilitate a subsequent electroplating fill process. After plating, the excess metal (known as "overburden") located on top of the filled traces is removed by a chemical mechanical planarization or chemical mechanical polishing (CMP) process. A mild heat treatment is typically applied to the metal prior to CMP to induce crystal grain growth and stabilize the metal. Following CMP the planarized metal traces form the usable conductive interconnects.

Presently known processes add a dopant material to the plating bath in a process known as alloy plating. It is also known to add dopants to the metal seed layer prior to electroplating. In particular, the dopant material may be incorporated into the sputter target used to deposit the seed layer in the contact trenches. The dopant material impedes electromigration and stress-migration induced voiding in the finished metal interconnects. In contrast, in accordance with a preferred embodiment the dopant material is added through the top of the overburden by indiffusion under heat treatment. This may be accomplished by adding a layer of dopant material on top of the overburden, and diffusing the dopant into the overburden through an annealing (heat treatment) process.

Ideally, the thickness of the dopant layer should be sufficient to provide the desired amount of alloying material, but not more, so that the entire layer is "consumed" (diffused) during annealing. This allows precise control of dopant composition and concentration. The process thereafter proceeds to CMP, as discussed above in the context of presently known processes. Inasmuch as no other changes are required to other processing steps, the foregoing new and improved doping approach is both simple and cost effective as opposed to the presently known method of applying the dopant material to the seed layer prior to electroplating.

Although the terms "MOS" and "MOSFET" device properly refer to a device having a metal gate electrode and an oxide gate insulator, as used herein these terms refer to any semiconductor device that includes a conductive gate electrode (whether metal or other conductive material) that is positioned over a gate insulator (whether oxide or other insulator) which, in turn, is positioned over a semiconductor substrate.

In addition, various steps in the manufacture of MOSFET transistors are well known and, consequently, in the interest of brevity many conventional steps are mentioned only briefly herein or omitted entirely without providing the well known process details.

Methods for fabricating IC device 50 in accordance with one embodiment may begin, as illustrated in FIG. 1, by providing a semiconductor substrate 60 having a surface 62. The semiconductor substrate can be silicon (Si), silicon admixed with germanium (SiGe), carbon, or other semiconductor material used in the semiconductor industry such as gallium arsenide (GaAs). Isolation regions 64 such as shallow trench isolation (STI) are formed in the semiconductor substrate, extend into the substrate from the surface, and serve to aid in defining a well region 66. Isolation regions 64 provide electrical isolation between a device (or devices) formed in well region 66, and devices formed in adjacent well regions. Although not used in all ICs, a buried layer 68 may be formed underlying the well region. For an n-channel MOS transistor the well region is impurity doped p-type.

In accordance with one embodiment the method of fabricating a semiconductor device continues by forming a thin insulating layer 70 on surface 62. A layer 72 of metal, silicon or dummy gate material such as polycrystalline silicon is deposited over the thin insulating layer.

Figure 2:
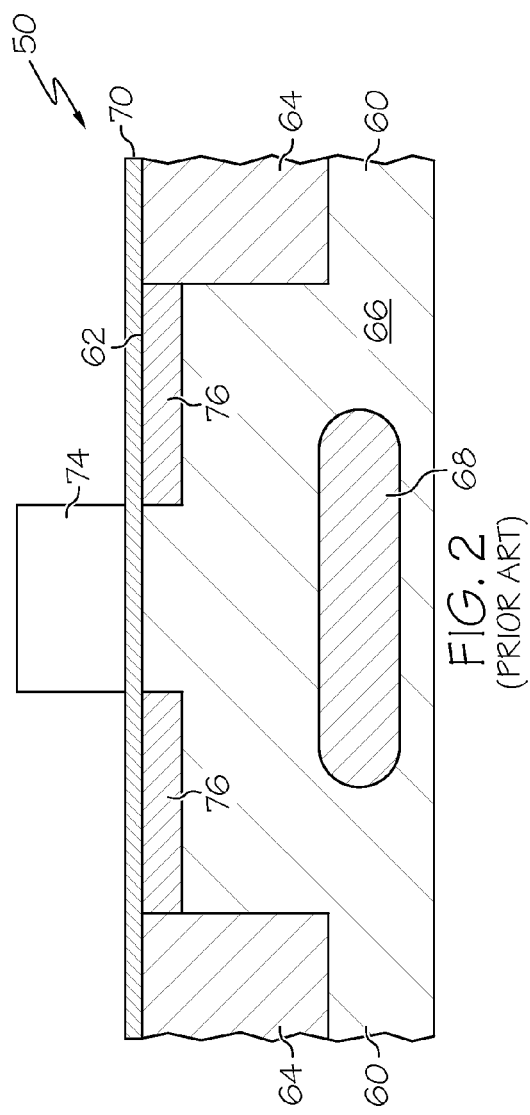

As illustrated in FIG. 2, the method continues by patterning layer 72 to form a gate or other structure 74. Structure 74 can be formed by conventional photolithographic patterning and anisotropic etching, for example by reactive ion etching (RIE). In accordance with one embodiment source and drain extensions 76 are formed by ion implanting n-type conductivity determining ions such as arsenic ions into the surface of the well region using structure 74 as an ion implantation mask. The source and drain extensions are thus self aligned to structure 74.

Figure 3:
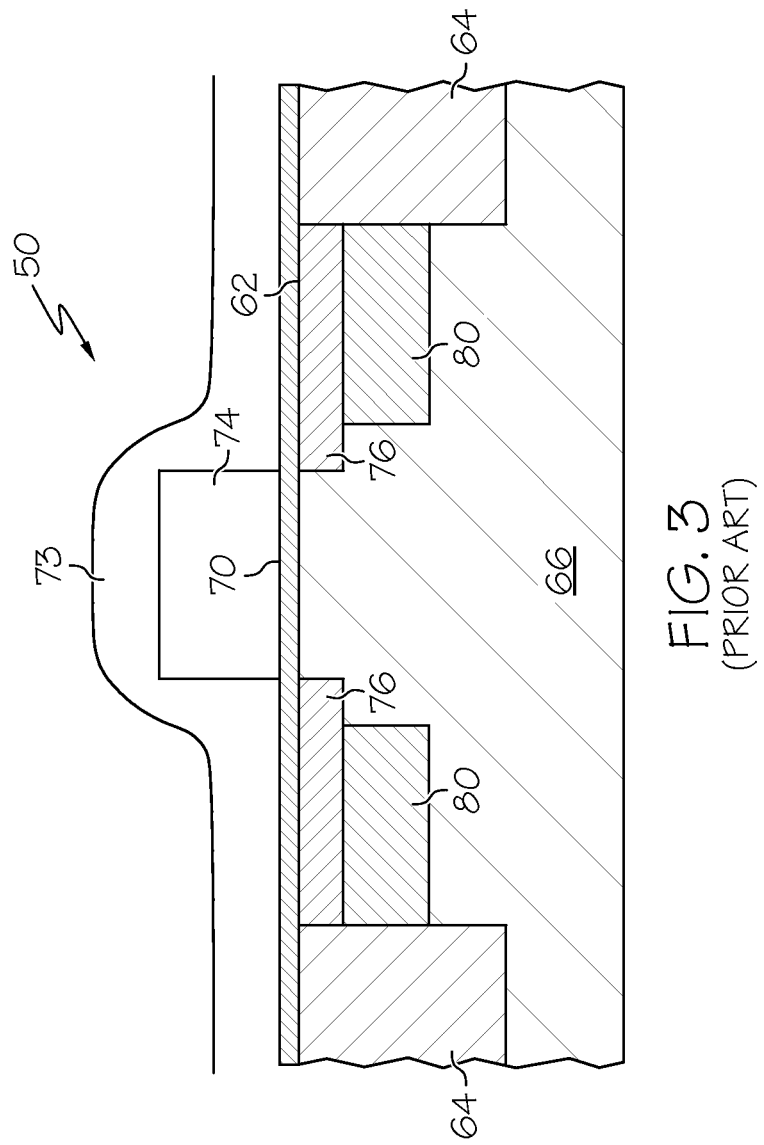

As illustrated in FIG. 3, sidewall spacers 78 are formed on the edges of structure 74. The sidewall spacers can be formed, for example, by depositing a layer 73 of dielectric material such as an oxide or a nitride overlying structure 74 and insulating layer 70. The dielectric material is anisotropically etched with the anisotropic etching continuing to etch the exposed portion of thin insulating layer 70, to produce sidewall spacers 78 (see FIG. 4).

Figure 4:
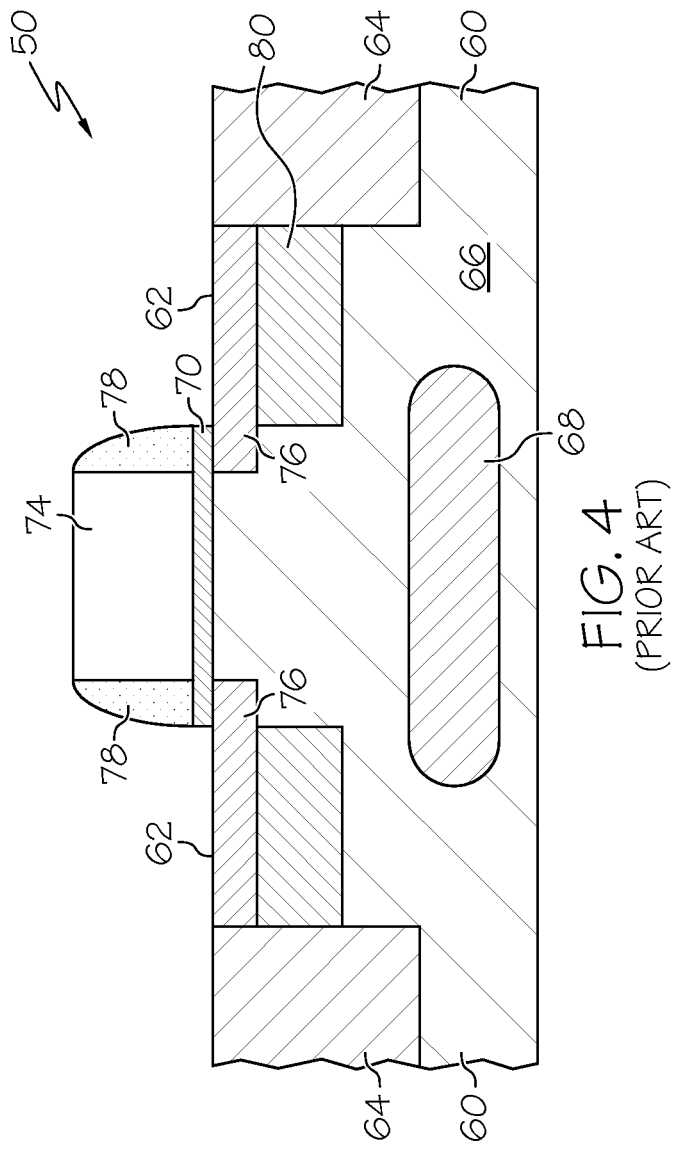

Referring to FIG. 4, deep source and drain regions 80 are formed, for example, by ion implanting n-type conductivity determining ions such as arsenic or phosphorous ions into the surface of well region 66 using structure 74 and sidewall spacers 78 as an ion implantation mask. The deep source and drain regions are thus self aligned to the sidewall spacers and also self aligned to and spaced apart from structure 74. The device structure is thermally annealed, for example by a rapid thermal annealing (RTA), to activate the implanted ions.

Referring now to FIGS. 3-4, structure 74 suitably includes a gate electrode 94, and layer 70 suitably includes a gate insulator 92. Gate insulator 92 can be, for example, a layer of thermally grown silicon dioxide, perhaps admixed with nitrogen, overlaid by a layer of a hafnium oxide or other high k dielectric material. The composite gate insulator is a high k insulator as it has a dielectric greater than the dielectric constant of silicon dioxide alone. The gate electrode material can be, for example, a layer of metal overlaid by a layer of polycrystalline silicon. The layer of metal can be selected, as well known by those of skill in the art, to effect a proper threshold voltage for the MOSFET device being fabricated Device 50 is further processed by conventional middle of line (MOL) and back end of line (BEOL) processing steps. For example, interconnecting the many transistors that make up a finished integrated circuit requires several layers or levels of interconnect routing. In a preferred embodiment, contact trenches are formed in a dielectric layer, and the trenches are filled with copper to form the device's conductive interconnects.

Figure 5:
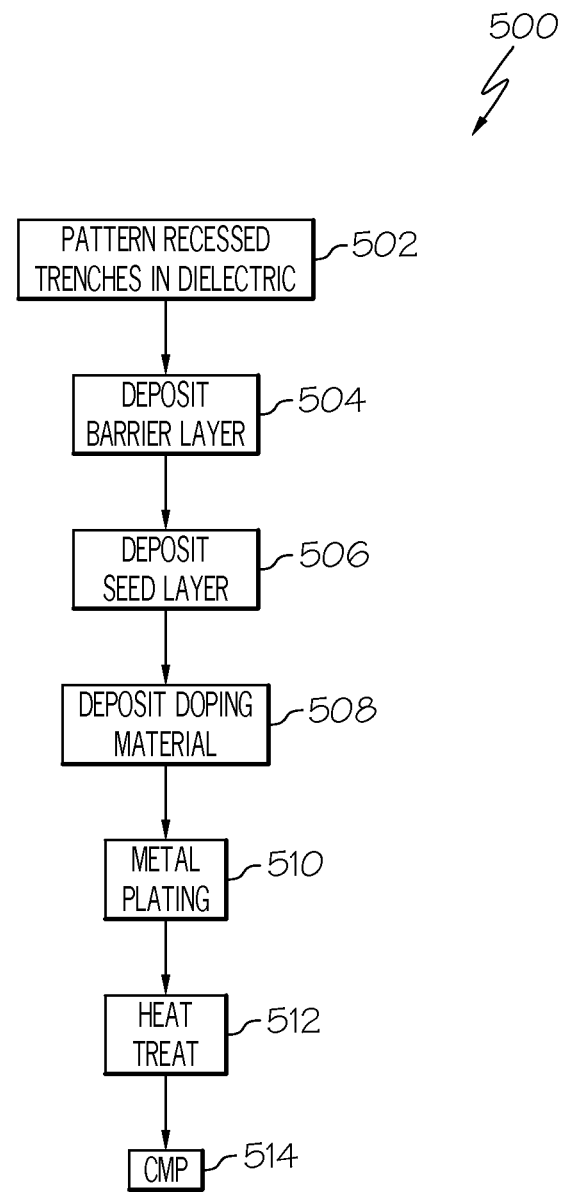
FIG. 5 is a process flow chart illustrating a conductive interconnect fabrication sequence in accordance with the prior art.

More particularly and referring now to FIG. 5, presently known interconnect fabrication process 500 involves patterning recessed trenches in a dielectric layer (step 502) and depositing a barrier layer (step 504) in the trench. The trenches may be formed using known photolithographic processes. The barrier layer may be composed of a barrier metal, for example tantalum, and may be deposited by physical vapor deposition (PVD), chemical vapor deposition (CVD), or plasma enhanced chemical vapor deposition (PECVD).

A seed layer is deposited atop the barrier layer (step 506) to facilitate subsequent electroplating of the metal layer in the trenches. Presently known processes incorporate the doping material into the seed layer, for example by incorporating a doping material into the sputter target used to deposit the seed layer. In the prior art process 500 shown in FIG. 5, a dopant material, for example aluminum, manganese, palladium, gold, zirconium, and their alloys, is deposited on top of the seed layer (step 508). The trenches, including the doped seed layer and the underlying barrier layer, are then overfilled with copper (including an overburden) using any conventional plating process (step 510). In a preferred embodiment, copper is deposited in the trenches using an electroless or electrolytic plating process. A mild heat treatment is applied to the copper (step 512) to induce crystal grain growth and to stabilize the metal. The excess copper (overburden) is then removed by chemical mechanical planarization (step 514).

Figure 6:
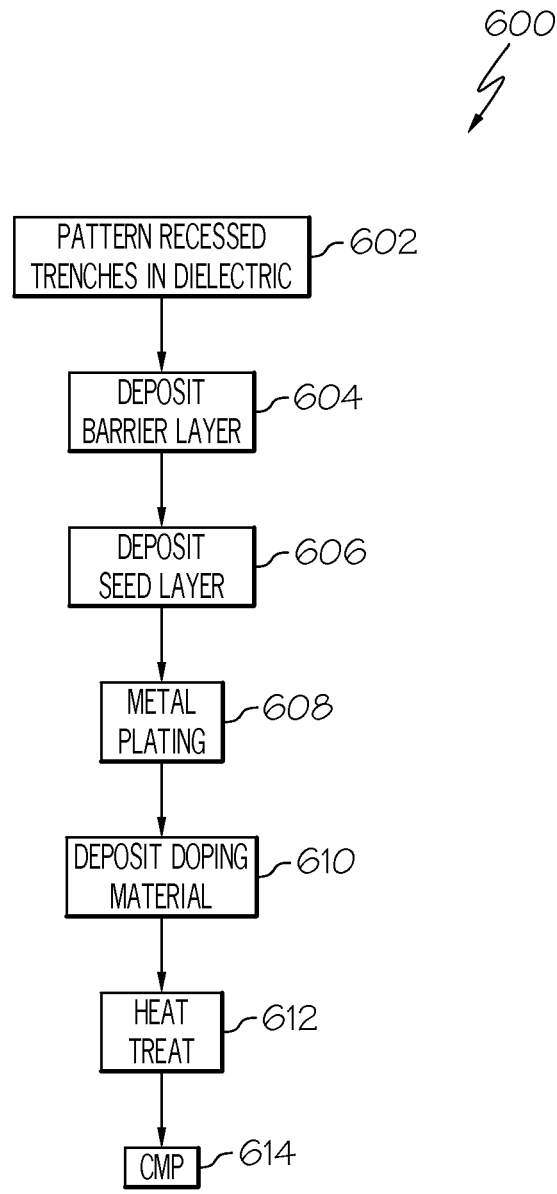
FIG. 6 is a process flow chart setting forth new and improved methods for forming a doped conductive interconnect in accordance with a preferred embodiment.

Referring now to FIG. 6, a new and improved process 600 for fabricating an integrated circuit including forming doped interconnects in the IC in accordance with a preferred embodiment begins with patterning recessed trenches in a dielectric layer (step 602). A barrier layer, for example tantalum, is formed on the surface of the dielectric layer (step 604). The barrier layer impedes electromigration of the conductive interconnect material, and is typically deposited over the entire surface of the dielectric layer, i.e., both inside the trenches and in field areas between trenches.

Those skilled in the art will appreciate that many conductive metals do not easily plate to tantalum and, therefore, a seed layer is deposited over the barrier layer in the contact trenches (step 606). The seed layer may be deposited at a thickness in the range of 2-200 nanometers, and preferably about 10-20 nanometers. The seed layer and the barrier layer may be deposited using a thin film deposition process such as physical vapor deposition (PVD), chemical vapor deposition (CVD), plasma enhanced chemical vapor deposition (PECVD), or even atomic layer deposition (ALD).

Rather than alloying the seed layer with a dopant as in prior art processes, in a preferred embodiment an undoped seed layer is employed, whereupon the trenches are filled with a conductive metal (including an overburden) using an electroplating process (step 608). In a preferred embodiment, copper is used, although various noble and semi-noble metals may also be used as conductors such as gold, palladium, platinum, nickel, iron, zinc, selenium, ruthenium, rhodium, silver, indium, tin, and iridium. One benefit of this approach is that the undoped seed may interfere less with the copper recrystallization and grain stabilization as, compared to the use of a doped seed.

A layer of dopant material is then placed on top of the plated copper (step 610), and diffused into the copper by heat treatment (annealing) at a temperature in the range of 20-1200 C, and preferably up to about 400 C for 2-60 minutes. Alternatively, a rapid thermal annealing process may be employed that runs only for a few milliseconds up to 2 seconds. Suitable doping materials may include aluminum, manganese, palladium, gold, zirconium, magnesium, titanium, hafnium, vanadium, niobium, chromium, iron, cobalt, nickel, zinc, cadmium, silver, mercury, indium, gallium, thallium, boron, silicon, germanium, tin, lead, bismuth, phosphorus, and selenium. The doping material may be at a thickness in the range of about 2-20 nanometers, and preferably about 10 nanometers, to achieve doping concentration levels in the range of, for example, 0.1-1%. Ideally, the thickness of the dopant layer is sufficient to provide the desired amount of alloying element, but no more, so that the dopant layer is entirely consumed during subsequent heat treatment (step 612); that is, all of the dopant material is diffused into the copper during the annealing process. In this way, precise control of the alloy composition may be achieved. The process sequence continues to CMP (step 614) as previously described.

In a preferred embodiment, doping the plated copper makes it unnecessary to use a doped seed layer. In an alternate embodiment, both the seed layer and plated metal may be doped, if desired.

It should be noted that the distance by which the alloying element (dopant) diffuses into the copper is a function of time and temperature. Thus, in order to more carefully control the depth of penetration of the dopant material into the copper, the overburden may be partially polished (removing the bulk volume of copper) before adding the dopant, thereby shortening the distance the dopant has to diffuse. This, in turn, can reduce the time and/or temperature required to achieve the desired dopant concentration.

Figure 7:
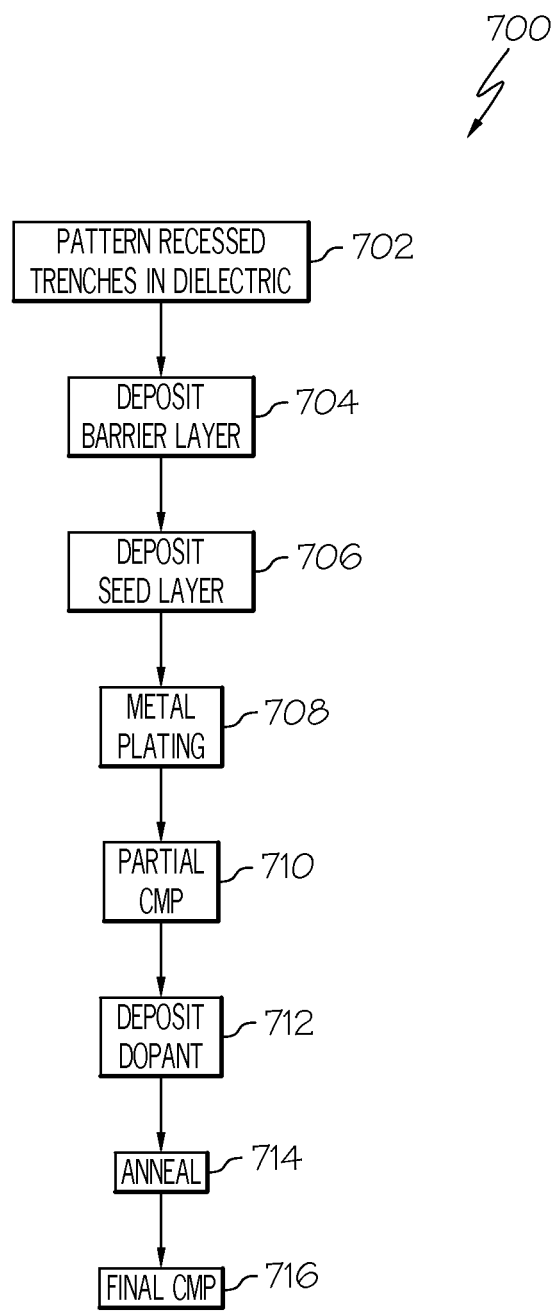
FIG. 7 is a process flow chart setting forth an alternate preferred embodiment of an improved method for forming a doped conductive interconnect.

More particularly and referring now to FIG. 7, a new and improved process 700 for fabricating an IC including forming doped interconnects in the IC in accordance with an alternate embodiment begins with patterning recessed trenches in a dielectric layer (step 702). A barrier layer is placed in the trenches (step 704), followed by a copper seed layer (step 706), whereupon the trenches are plated with copper as described above in connection with FIG. 6 (step 708). Rather than adding the doping material at this stage of the process, in the alternate embodiment illustrated in FIG. 7 a partial CMP is performed (step 714) to remove all or a portion of the overburden (the initial CMP step). The dopant layer is then deposited atop the copper (step 712) and annealed (step 714), followed by additional CMP processing (step 716) to remove any remaining excess copper, and to remove excess barrier film (e.g. tantalum).

FIG. 8 is a cross section view of a portion of an integrated circuit 850 formed in and on a semiconductor substrate including a doped conductive interconnect formed within a contact trench in accordance with one embodiment. More particularly, a plurality of recessed trenches 810 are patterned on a dielectric layer 804 of a semiconductor substrate 802 (FIG. 8a). Before plating the trenches with copper, a barrier layer and a seed layer are laid down in the trenches, but are not shown in FIG. 8 to enhance clarity. The trench is filled with copper 806, including an overburden which extends beyond the trench (FIG. 8b).

Figure 8A:
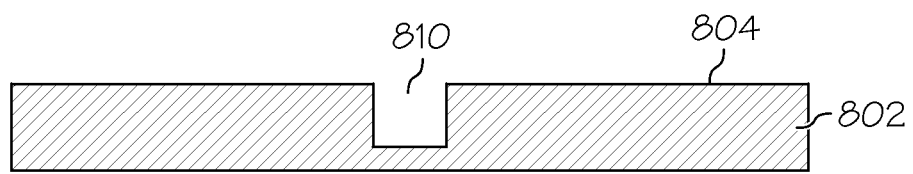
FIGS. 8-9 are cross section views of an integrated circuit device having doped conductive interconnects fabricated in accordance with a preferred embodiment.
Figure 8B:
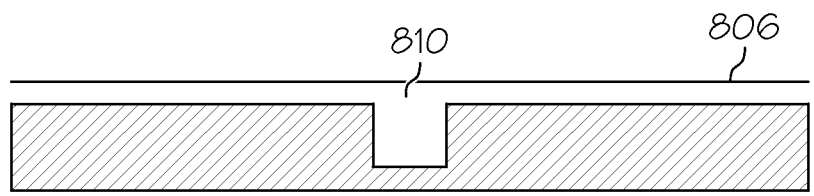
Figure 8C:
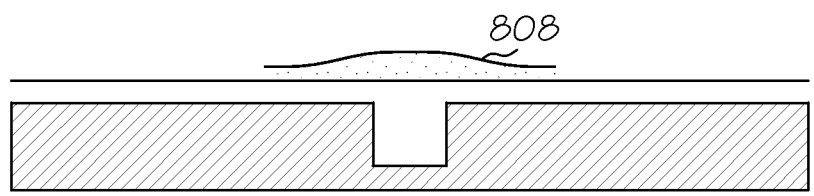
Figure 8D:
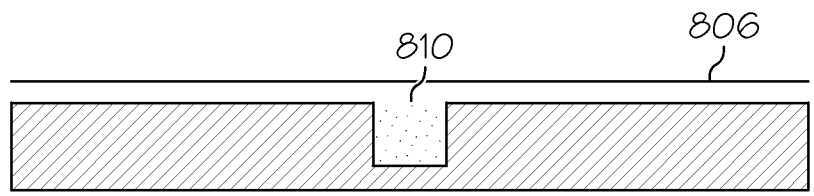
Figure 8E:
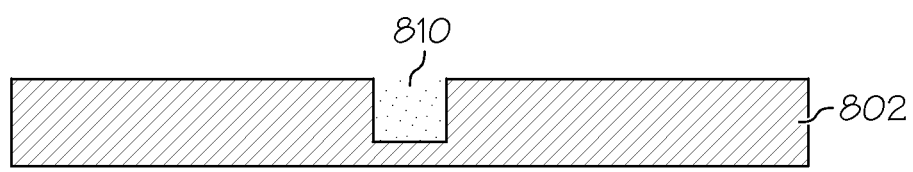
Figure 9A:
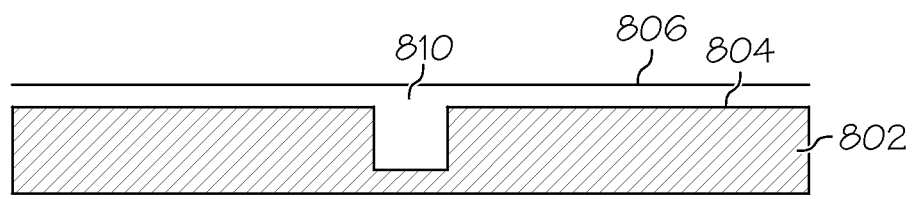
Figure 9B:
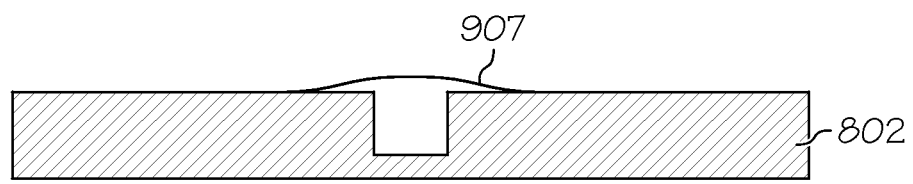
Figure 9C:
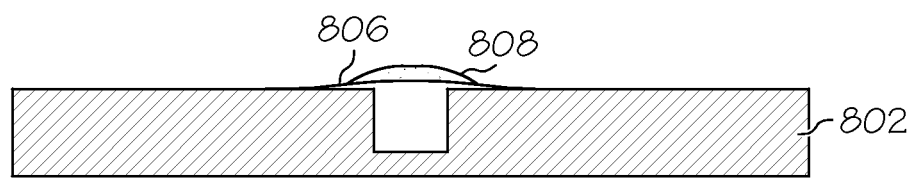
Figure 9D:
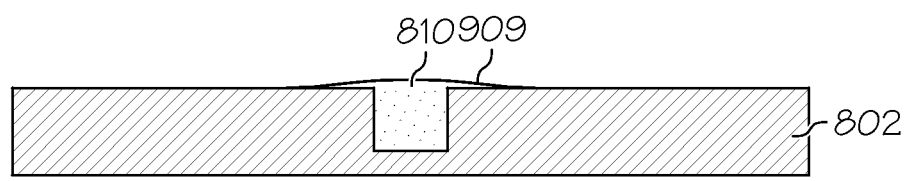
Figure 9E:
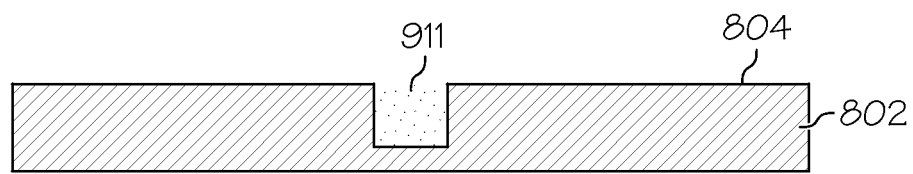

In a preferred embodiment, a dopant material 808 is deposited on top of copper layer 806 (FIG. 8c). A mild heat treatment is applied which diffuses the dopant into the copper (FIG. 8d). The wafer then undergoes chemical mechanical planarization to remove the overburden, leaving the usable doped copper interconnect within trench 810.

FIG. 9 is a cross section view of a semiconductor substrate including a doped conductive interconnect formed within a contact trench in accordance with an alternate embodiment. More particularly, recessed trenches 810 are patterned onto dielectric layer 804 of semiconductor substrate 802, and the trenches are plated with copper 806 (FIG. 9a). The wafer then undergoes partial CMP to remove the bulk of the overburden, leaving residual overburden 907 over trench 810 (FIG. 9b). Dopant layer 808 is laid down on copper layer 806 (FIG. 9c), and annealed to diffuse the dopant into the copper, leaving a portion 909 of excess doped copper (FIG. 9d). The residual copper 909 is then removed by conventional CMP to produce usable conductive interconnect 911 within trench 810 (FIG. 9e).

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. Various changes can be made in the size, spacing and geometries of elements without departing from the scope of the invention as set forth in the appended claims and the legal equivalents thereof.

What is claimed is:

1. A method for controlling the concentration of dopant in doped conductive interconnects during fabrication of integrated circuit device on a semiconductor substrate, comprising:
   forming a dielectric layer over said substrate;
   patterning a plurality of contact trenches in said dielectric layer, the trenches having a top surface;
   depositing a barrier layer in said trenches;
   depositing a metal seed layer over said abarrier layer in said trenches;
   thereafter filling said trenches with metal including an overburden;
   using chemical mechanical planarization (CMP) to planarizing said overburden to approximately the top surface of said trenches;
   depositing a dopant material over said planarized overburden in the range of 2-20 nm in thickness; and
   diffusing substantially all of said dopant material into said metal to thereby achieve a doping concentration level in the doped metal in the range of about 0.1-1%;
   wherein said depositing a dopant material comprises depositing at least one of aluminum, manganese, palladium, gold, zirconium, magnesium, titanium, hafnium, vanadium, niobium, chromium, iron, cobalt, nickel, zinc, cadmium, silver, mercury, indium, gallium, thallium, boron, silicon, germanium, tin, lead, bismuth, phosphorus, and selenium.

2. The method of claim 1 wherein filling comprises depositing copper.

3. The method of claim 1, wherein said patterning comprises photolithographically patterning contact trenches in said dielectric.

4. The method of claim 1, wherein said depositing a barrier layer comprises depositing a layer of tantalum.

5. The method of claim 1, wherein said diffusing comprises exposing said substrate to a predetermined elevated temperature range for a predetermined period of time.

6. The method of claim 1, wherein said depositing a barrier layer comprises depositing tantalum by at least one of physical vapor deposition, chemical vapor deposition, and plasma enhanced chemical vapor deposition.

7. The method of claim 1, wherein said depositing a seed layer comprises depositing a seed layer of copper by at least one of physical vapor deposition, chemical vapor deposition, and plasma enhanced chemical vapor deposition.

8. The method of claim 1, wherein said filling comprises electroplating copper onto said seed layer.

9. The method of claim 8 wherein said electroplating comprises electrolytic electroplating.

10. The method of claim 2, wherein said diffusing comprises annealing to diffuse substantially all of said doping material into said copper.

11. The method of claim 1, wherein said silicon substrate comprises at least one of: silicon; silicon admixed with germanium; and silicon admixed with carbon.

12. A method for fabricating an integrated circuit device on a semiconductor substrate having doped conductive interconnects, comprising:
   forming a dielectric layer over said substrate;
   patterning a plurality of contact trenches in said dielectric layer;
   depositing a barrier layer in said trenches;
   depositing a metal seed layer over said barrier layer in said trenches;
   filling said trenches with metal including an overburden;
   removing the bulk of said overburden and leaving a substantially planar remaining portion of said overburden;
   depositing a dopant material over said remaining portion of said overburden in the range of 2-20 nm in thickness; and
   diffusing substantially all of said dopant material into said metal to thereby achieve a doping concentration level in the doped metal in the range of about 0.1-1%;
   wherein said depositing a dopant material comprises depositing at least one of aluminum, manganese, palladium, gold, zirconium, magnesium, titanium, hafnium, vanadium, niobium, chromium, iron, cobalt, nickel, zinc, cadmium, silver, mercury, indium, gallium, thallium, boron, silicon, germanium, tin, lead, bismuth, phosphorus, and selenium.

13. The method of claim 12, further comprising removing said remaining portion of said overburden following said diffusing.

14. The method of claim 12, wherein:
   said depositing a barrier layer comprises depositing tantalum;
   said filling comprises filling with copper including said overburden; and
   said patterning comprises photolithographically patterning said contact trenches in said dielectric layer.

15. The method of claim 14, wherein:
   said diffusing comprises exposing said substrate to a predetermined elevated temperature range for a predetermined period of time;
   said depositing a barrier layer and said depositing said seed layer comprise at least one of physical vapor deposition, chemical vapor deposition, and plasma enhanced chemical vapor deposition;
   said filling comprises electroplating; and
   said depositing a dopant material comprises depositing at least one of aluminum, manganese, palladium, gold, and zirconium.

* * * * *